(12) United States Patent
Kozuka et al.

(10) Patent No.: US 10,883,192 B2
(45) Date of Patent: Jan. 5, 2021

(54) SINTERED ELECTRICALLY CONDUCTIVE OXIDE FOR OXYGEN SENSOR ELECTRODE, AND OXYGEN SENSOR USING THE SAME

(71) Applicant: NGK SPARK PLUG CO., LTD., Nagoya (JP)

(72) Inventors: Hisashi Kozuka, Ichinomiya (JP); Yasuyuki Okimura, Inuyama (JP); Kazushige Ohbayashi, Nagoya (JP)

(73) Assignee: NGK SPARK PLUG CO., LTD., Nagoya (JP)

( * ) Notice: Subject to any disclaimer, the term of this patent is extended or adjusted under 35 U.S.C. 154(b) by 425 days.

(21) Appl. No.: 15/152,888

(22) Filed: May 12, 2016

(65) Prior Publication Data

US 2016/0334361 A1    Nov. 17, 2016

(30) Foreign Application Priority Data

May 13, 2015  (JP) .................... 2015-097946

(51) Int. Cl.
| | |
|---|---|
| *G01N 27/407* | (2006.01) |
| *G01N 27/30* | (2006.01) |
| *C30B 29/22* | (2006.01) |
| *G01N 27/12* | (2006.01) |
| *C04B 35/632* | (2006.01) |

(Continued)

(52) U.S. Cl.
CPC .............. *C30B 29/22* (2013.01); *C04B 35/50* (2013.01); *C04B 35/62625* (2013.01); *C04B 35/62655* (2013.01); *C04B 35/62675* (2013.01); *C04B 35/62695* (2013.01); *C04B 35/632* (2013.01); *G01N 27/125* (2013.01); *C04B 2235/327* (2013.01); *C04B 2235/3227* (2013.01); *C04B 2235/3275* (2013.01); *C04B 2235/3279* (2013.01); *C04B 2235/604* (2013.01);

(Continued)

(58) Field of Classification Search
CPC .... G01N 27/125; G01N 27/30; G01N 27/304; G01N 27/407; G01N 27/4071; G01N 27/4073; G01N 27/4074; G01N 27/4075; G01N 27/4076; G01N 27/406–4118; C30B 29/22; B01J 23/002

See application file for complete search history.

(56) References Cited

U.S. PATENT DOCUMENTS

| | | | | |
|---|---|---|---|---|
| 4,885,078 A | * | 12/1989 | Spengler | ................. H01M 8/02 204/424 |
| 5,035,962 A | * | 7/1991 | Jensen | ................ H01M 4/9066 204/291 |

(Continued)

FOREIGN PATENT DOCUMENTS

| | | | | |
|---|---|---|---|---|
| DE | 2341256 A1 | * | 2/1975 | ........... G01N 27/333 |
| EP | 2369667 A1 | | 9/2011 | |

(Continued)

OTHER PUBLICATIONS

English Translation of DE 2341256 (Year: 1975).*

*Primary Examiner* — Gurpreet Kaur
(74) *Attorney, Agent, or Firm* — Sughrue Mion, PLLC

(57) ABSTRACT

A sintered electrically conductive oxide for an oxygen sensor electrode includes a crystal phase formed of a perovskite-type electrically conductive oxide containing at least La, Fe and Ni. The oxide has an absolute value of thermo-electromotive force at 770° C. of 21.0 μV/K or less.

9 Claims, 10 Drawing Sheets

(51) Int. Cl.
  *C04B 35/626* (2006.01)
  *C04B 35/50* (2006.01)
(52) U.S. Cl.
  CPC .... *C04B 2235/72* (2013.01); *C04B 2235/768* (2013.01); *C04B 2235/79* (2013.01)

(56) References Cited

U.S. PATENT DOCUMENTS

| | | | |
|---|---|---|---|
| 6,054,403 A | 4/2000 | Kawase et al. | |
| 6,270,642 B1* | 8/2001 | Basu | C25D 13/02 204/487 |
| 2005/0016848 A1* | 1/2005 | Sahimi | G01N 27/4071 204/427 |
| 2009/0013761 A1* | 1/2009 | Chou | G01N 27/407 73/31.05 |
| 2011/0236789 A1* | 9/2011 | Namba | C01G 53/006 429/489 |
| 2012/0037502 A1* | 2/2012 | Nagayama | C04B 35/453 204/298.13 |
| 2014/0050842 A1* | 2/2014 | Fujii | G01N 27/407 427/126.2 |
| 2015/0099142 A1 | 4/2015 | Kozuka et al. | |

FOREIGN PATENT DOCUMENTS

| | | |
|---|---|---|
| JP | 2-269949 A | 11/1990 |
| JP | 3-165253 A | 7/1991 |
| JP | 2002-84006 A | 3/2002 |
| JP | 2002-87882 A | 3/2002 |
| JP | 3286906 B2 | 5/2002 |
| WO | 2013/150779 A1 | 10/2013 |

* cited by examiner

| Sample | Firing temp. °C | $La_aCo_bFe_cNi_dO_x$ Component element (mol ratio) | | | | Electrical conductivity σ | | | B constant | Thermoelectromotive force |
| --- | --- | --- | --- | --- | --- | --- | --- | --- | --- | --- |
| | | a | b | c | d | 25°C (S/cm) | 670°C (S/cm) | 870°C (S/cm) | (K⁻¹) | 770°C (μV/K) |
| S1 | 1,600 | 0.500 | 0.200 | 0.050 | 0.250 | 1,107 | 993 | | -44 | -11.0 |
| S2 | 1,600 | 0.500 | 0.150 | 0.100 | 0.250 | 751 | 846 | | 48 | -9.7 |
| S3 | 1,600 | 0.500 | 0.100 | 0.150 | 0.250 | 459 | 700 | | 170 | -10.6 |
| S4 | 1,600 | 0.500 | 0.050 | 0.200 | 0.250 | 382 | 562 | | 156 | -8.6 |
| S5 | 1,600 | 0.500 | 0.010 | 0.240 | 0.250 | 308 | 495 | | 191 | -7.0 |
| S6 | 1,600 | 0.500 | 0.000 | 0.250 | 0.250 | 298 | 466 | | 180 | -6.5 |
| S7 | 1,600 | 0.500 | 0.000 | 0.225 | 0.275 | 581 | 613 | | 22 | -7.1 |
| S8 | 1,600 | 0.500 | 0.000 | 0.275 | 0.225 | 201 | 289 | | 146 | 1.9 |
| S9 | 1,600 | 0.500 | 0.000 | 0.200 | 0.300 | 821 | 796 | | -12 | -5.4 |
| S10 | 1,600 | 0.500 | 0.000 | 0.150 | 0.350 | 363 | 451 | | 87 | -8.7 |
| S11 | 1,600 | 0.500 | 0.050 | 0.250 | 0.200 | 243 | 391 | | 192 | 9.5 |
| S12 | 1,600 | 0.500 | 0.050 | 0.225 | 0.225 | 365 | 510 | | 135 | -1.6 |
| S13 | 1,600 | 0.500 | 0.050 | 0.150 | 0.300 | 767 | 882 | | 56 | -8.4 |
| S14 | 1,600 | 0.500 | 0.050 | 0.100 | 0.350 | 403 | 531 | | 111 | -9.9 |
| S15 | 1,600 | 0.474 | 0.053 | 0.211 | 0.263 | 354 | 561 | | 186 | -9.3 |
| S16 | 1,600 | 0.487 | 0.051 | 0.205 | 0.256 | 374 | 555 | | 159 | -8.8 |
| S17 | 1,600 | 0.512 | 0.049 | 0.195 | 0.244 | 213 | 347 | | 197 | -10.7 |
| S21* | 1,350 | 0.500 | 0.250 | 0.000 | 0.250 | 1,264 | 1,092 | | -59 | -23.5 |
| S22* | 1,550 | 0.500 | 0.250 | 0.000 | 0.250 | 1,929 | 1,465 | | -105 | -14.1 |
| S23 | 1,600 | 0.459 | 0.054 | 0.216 | 0.270 | 183 | 375 | | 289 | -12.4 |
| S24 | 1,600 | 0.524 | 0.190 | 0.048 | 0.238 | 145 | 351 | | 356 | -13.8 |
| S25 | 1,600 | 0.500 | 0.000 | 0.100 | 0.400 | 175 | 357 | | 170 | -16.3 |
| S26* | 1,600 | 0.535 | 0.186 | 0.047 | 0.233 | Not sintered | Not sintered | | Not sintered | Not sintered |
| S27* | 1,600 | 0.500 | 0.000 | 0.350 | 0.150 | 8.4 | 137 | | 1,127 | 39.8 |
| S28* | 1,600 | 0.500 | 0.000 | 0.050 | 0.450 | 75 | 176 | | 346 | -35.6 |

FIG. 4

CHANGE IN PHYSICAL PROPERTIES WITH Fe/Co RATIO (a = 0.500, d = 0.250)

| Sample | Firing temp. °C | $La_aCo_bFe_cNi_dO_x$ Component element (mol ratio) | | | | Electrical conductivity σ | | B constant | Thermoelectromotive force |
|---|---|---|---|---|---|---|---|---|---|
| | | a | b | c | d | 25°C (S/cm) | 870°C (S/cm) | (K⁻¹) | 770°C (μV/K) |
| S22* | 1,550 | 0.500 | 0.250 | 0.000 | 0.250 | 1,923 | 1,485 | -105 | -14.1 |
| S1 | 1,600 | 0.500 | 0.200 | 0.050 | 0.250 | 1,107 | 993 | -44 | -11.0 |
| S2 | 1,600 | 0.500 | 0.150 | 0.100 | 0.250 | 751 | 846 | 46 | -9.7 |
| S3 | 1,600 | 0.500 | 0.100 | 0.150 | 0.250 | 459 | 700 | 170 | -10.6 |
| S4 | 1,600 | 0.500 | 0.050 | 0.200 | 0.250 | 382 | 562 | 156 | -8.6 |
| S5 | 1,600 | 0.500 | 0.010 | 0.240 | 0.250 | 308 | 495 | 191 | -7.0 |
| S6 | 1,600 | 0.500 | 0.000 | 0.250 | 0.250 | 298 | 466 | 180 | -6.5 |

FIG. 5

CHANGE IN PHYSICAL PROPERTIES WITH Ni/Fe RATIO (a = 0.500, d = 0.250)

| Sample | La$_a$Co$_b$Fe$_c$Ni$_d$O$_x$ | | | | Electrical conductivity σ | | B constant | Thermoelectromotive force |
|---|---|---|---|---|---|---|---|---|
| | Component element (mol ratio) | | | | 25°C | 870°C | | 770°C |
| | a | b | c | d | (S/cm) | (S/cm) | (K$^{-1}$) | (µV/K) |
| S6 | 0.500 | 0.000 | 0.250 | 0.250 | 298 | 466 | 180 | -6.5 |
| S7 | 0.500 | 0.000 | 0.225 | 0.275 | 581 | 613 | 22 | -7.1 |
| S8 | 0.500 | 0.000 | 0.275 | 0.225 | 201 | 289 | 146 | 1.9 |
| S9 | 0.500 | 0.000 | 0.200 | 0.300 | 821 | 746 | -12 | -5.4 |
| S10 | 0.500 | 0.000 | 0.150 | 0.350 | 363 | 451 | 87 | -8.7 |
| S25 | 0.500 | 0.000 | 0.100 | 0.400 | 175 | 357 | 170 | -16.3 |
| S27* | 0.500 | 0.000 | 0.350 | 0.150 | 8.4 | 137 | 1,127 | 39.8 |
| S28* | 0.500 | 0.000 | 0.050 | 0.450 | 75 | 176 | 346 | -35.6 |

FIG. 7

CHANGE IN THERMOELECTROMOTIVE FORCE WITH FIRING TEMPERATURES

| Sample | Firing temp. °C | $La_a Co_b Fe_c Ni_d O_x$ Component element (mol ratio) | | | | Thermoelectromotive force 770°C (μV/K) |
|---|---|---|---|---|---|---|
| | | a | b | c | d | |
| S31 | 1,200 | 0.500 | 0.000 | 0.250 | 0.250 | Unmeasurable due to insufficient sintering |
| S32 | 1,300 | 0.500 | 0.000 | 0.250 | 0.250 | −15.4 |
| S33 | 1,500 | 0.500 | 0.000 | 0.250 | 0.250 | −7.8 |
| S34 (=S6) | 1,600 | 0.500 | 0.000 | 0.250 | 0.250 | −6.5 |
| S41 | 1,300 | 0.500 | 0.000 | 0.150 | 0.350 | −21.0 |
| S42 (=S10) | 1,600 | 0.500 | 0.000 | 0.150 | 0.350 | −8.7 |
| S21* | 1,350 | 0.500 | 0.250 | 0.000 | 0.250 | −23.5 |
| S22* | 1,550 | 0.500 | 0.250 | 0.000 | 0.250 | −14.1 |

FIG. 9

CHANGE IN PHYSICAL PROPERTIES WITH La MATERIALS

| Sample | Firing temp. °C | La material | $La_aCo_bFe_cNi_dO_x$ Component element (mol ratio) ||||  Electrical conductivity σ |||  B constant ($K^{-1}$) | Thermoelectromotive force 770°C (μV/K) |
|---|---|---|---|---|---|---|---|---|---|---|---|
|  |  |  | a | b | c | d | 25°C (S/cm) | 870°C (S/cm) |  |  |
| S51 (=S6) | 1,600 | La(OH)$_3$ | 0.500 | 0.000 | 0.250 | 0.250 | 298 | 466 | 180 | -6.5 |
| S52* | 1,600 | La$_2$O$_3$ | 0.500 | 0.000 | 0.250 | 0.250 | unmeasurable due to generation of crack |||||
| S53 (=S8) | 1,600 | La(OH)$_3$ | 0.500 | 0.000 | 0.275 | 0.225 | 201 | 289 | 146 | 1.9 |
| S54* | 1,600 | La$_2$O$_3$ | 0.500 | 0.000 | 0.275 | 0.225 | 98 | 197 | 281 | 13.1 |

FIG. 10

SINTERED ELECTRICALLY CONDUCTIVE OXIDE FOR OXYGEN SENSOR ELECTRODE, AND OXYGEN SENSOR USING THE SAME

BACKGROUND OF THE INVENTION

1. Field of the Invention

The present invention relates to a sintered electrically conductive oxide for an oxygen sensor electrode and to an oxygen sensor using the same.

2. Description of the Related Art

A ceramic product as an electronic component includes a ceramic substrate, and an electrode provided on the ceramic substrate. The electrode is generally formed of metal. Examples of such a product include a multi-layer ceramic capacitor having an Ni electrode, a Pd electrode, or a Pt electrode; an LTCC component (Low Temperature Co-fired Ceramic Component) having an Ag electrode, a Cu electrode, or an Ag—Pd electrode; a piezoactuator having a Pd electrode; a semiconductor package having a W electrode; and a spark plug having an Ir electrode or a Pt electrode.

However, since Ni, Cu and W require atmospheric control when fired together with a ceramic substrate, it is difficult to secure the full capabilities of the ceramic substrate, and manufacturing costs increase. Meanwhile, since Ag has a low melting point (962° C.), the material of the ceramic substrate is limited; furthermore, because of firing at a low temperature, the physical properties of the ceramic substrate may deteriorate in some cases. Also, since noble metals such as Pd, Ir and Pt are expensive, application thereof to an electrode, which requires a large area, is difficult.

Patent Document 1 discloses, as an oxide for an electrode, a lanthanum-cobalt oxide having a high resistance at room temperature and a negative temperature coefficient such that its resistance decreases as its temperature increases. Patent Document 2 discloses a lanthanum-cobalt oxide which has a high resistance near room temperature and has a large absolute value of B constant at high temperature. However, the electrically conductive oxides disclosed in Patent Documents 1 and 2 have a high electrical resistivity at room temperature and thus insufficient electrical conductivity.

Since forming an electrode of a ceramic product from metal gives rise to various problems as mentioned above, the present inventors studied replacing an electrode with an oxide (ceramic). However, since conventional oxides have a very low electrical conductivity as compared with metal and have a very large absolute value of B constant (temperature coefficient), replacing the metal has been difficult. Known oxides having high electrical conductivity are ruthenium oxides ($RuO_2$, $SrRuO_3$, etc.); however, ruthenium is expensive. Thus, the present inventors have disclosed, in Patent Document 3, a sintered oxide which has a high electrical conductivity and a small absolute value of B constant (temperature coefficient) and is thus a suitable electrically conductive material. Also, Patent Documents 4 to 6 disclose various perovskite-type electrically conductive oxides.

[Patent Document 1] Japanese Patent No. 3286906
[Patent Document 2] Japanese Patent Application Laid-Open (kokai) No. 2002-087882
[Patent Document 3] International Publication No. WO2013/150779
[Patent Document 4] Japanese Patent Application Laid-Open (kokai) No. H02-269949
[Patent Document 5] Japanese Patent Application Laid-Open (kokai) No. H03-165253
[Patent Document 6] Japanese Patent Application Laid-Open (kokai) No. 2002-084006

3. Problems to be Solved by the Invention

However, the present inventors found a conventionally unrecognized problem relating to use of an electrically conductive oxide as an electrode of an oxygen sensor. Specifically, the present inventors found that an electrode material for use in the oxygen sensor must have a small absolute value of thermoelectromotive force. The reason for this is that, in the oxygen sensor, a temperature difference arises between a forward end portion exposed to high-temperature exhaust gas and adapted to detect oxygen concentration and a rear end portion exposed to ambient atmosphere and adapted to serve as a contact with an external circuit. Since the temperature difference may possibly reach about 500° C., in the case of an electrode material having a large thermoelectromotive force, a voltage difference generated between the opposite ends of an electrode due to the temperature difference generates a high level of noise, resulting in an increase in measurement error. Thus, when an electrically conductive oxide is to be used as an electrode material for use in the oxygen sensor, the electrically conductive oxide must have a small absolute value of thermoelectromotive force. However, conventionally, an electrically conductive oxide having such a characteristic has not been known.

SUMMARY OF THE INVENTION

The present invention has been achieved to solve the above problems of the related art, and an object thereof is to provide a sintered electrically conductive oxide for an oxygen sensor electrode having a small thermoelectromotive force The above object has been achieved, in a first aspect, by providing: (1) a sintered electrically conductive oxide for an oxygen sensor electrode including a crystal phase formed of a perovskite-type electrically conductive oxide containing at least La, Fe and Ni. The sintered electrically conductive oxide (1) is characterized in that it has an absolute value of thermoelectromotive force at 770° C. is 21.0 µV/K or less.

The above sintered electrically conductive oxide can be configured as an electrode material having a small absolute value of thermoelectromotive force and is suitable for forming an oxygen sensor electrode.

In a preferred embodiment (2) of the sintered electrically conductive oxide (1) above, the crystal phase has a perovskite-type oxide crystal structure expressed by the compositional formula: $La_aCo_bFe_cNi_dO_x$ (where $a+b+c+d=1$, $1.25 \leq x \leq 1.75$), and a, b, c and d satisfy $$0.474 \leq a \leq 0.512,$$

$$0 \leq b \leq 0.225,$$

$$0 \leq c \leq 0.300 \text{ and}$$

$$0.200 \leq d \leq 0.350.$$

This makes it possible to provide a sintered electrically conductive oxide for an oxygen sensor electrode having a high electrical conductivity and a small absolute value of B constant.

In another preferred embodiment (3) of the sintered electrically conductive oxide (2) above, a and b satisfy $$0.474 \leq a < 0.512 \text{ and}$$

$$0 V b \leq 0.100.$$

In this case, it is possible to further reduce the absolute value of thermoelectromotive force.

In yet another preferred embodiment (4), the sintered electrically conductive oxide of any of (1) to (3) above contains substantially no alkaline earth metal elements.

In this case, alkaline earth metal elements do not diffuse from an electrode formed of the sintered electrically conductive oxide for an oxygen sensor electrode to other members of the oxygen sensor. Therefore, the oxygen sensor is free from deterioration in physical properties of the electrode and from deterioration in performance (impedance, etc.) of the oxygen sensor, which would otherwise result from diffusion of alkaline earth metal elements.

In a second aspect, the present invention provides (5) a sintered electrically conductive oxide for an oxygen sensor electrode. The sintered electrically conductive oxide (5) includes a crystal phase having a perovskite-type oxide crystal structure expressed by the compositional formula: $La_aCo_bFe_cNi_dO_x$ (where $a+b+c+d \leq 1$, $1.25 \leq x \leq 1.75$), and a, b, c and d satisfy $$0.474 \leq a \leq 0.512,$$

$$0 \leq b \leq 0.225,$$

$$0 \leq c \leq 0.300 \text{ and}$$

$$0.200 \leq d \leq 0.350.$$

The sintered electrically conductive oxide (5) can be configured as an electrode material having a high electrical conductivity, a small absolute value of B constant, and a small absolute value of thermoelectromotive force.

The present invention can be embodied in various modes; for example, as an electrode which can be a reference electrode for an oxygen sensor formed of the sintered electrically conductive oxide, as an oxygen sensor comprising the electrode, and as a method of manufacturing the electrode and the oxygen sensor.

BRIEF DESCRIPTION OF THE DRAWINGS

FIG. 4 is a table showing compositions and physical properties of samples.

FIG. 5 is a table showing compositions and physical properties of those samples which differ in Fe and Co compositional proportions.

FIG. 7 is a table showing compositions and physical properties of those samples which differ in Fe and Ni compositional proportions.

FIG. 9 is a table showing the results of an experiment on the influence of firing temperature on thermoelectromotive force.

FIG. 10 is a table showing the results of an experiment on the influence of La materials on physical properties.

DESCRIPTION OF REFERENCE NUMERALS

Figure 1:
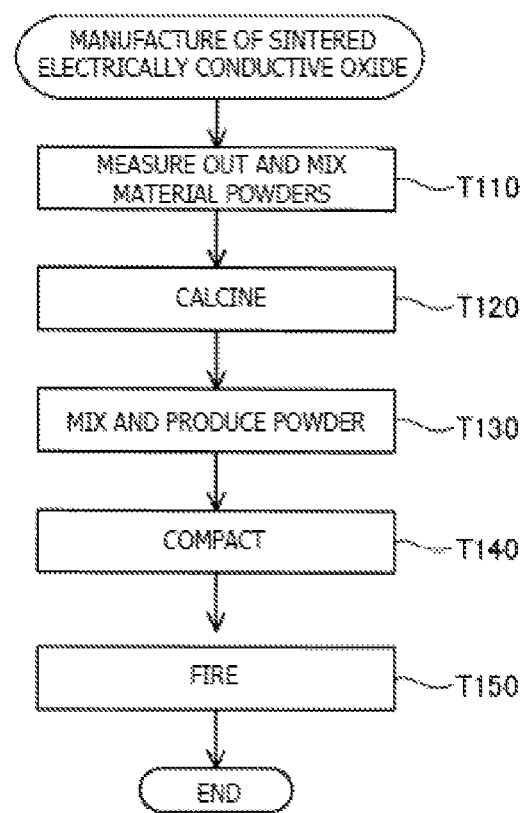
FIG. 1 is a flowchart showing a method of manufacturing a sintered electrically conductive oxide according to an embodiment of the present invention.

Reference numerals used to identify various features in the drawings include the following.
100: oxygen sensor
110: substrate
120: external electrode
130: reference electrode

DETAILED DESCRIPTION OF THE PREFERRED EMBODIMENTS

A. Sintered Electrically Conductive Oxide and its Composition

A sintered electrically conductive oxide according to an embodiment of the present invention contains a crystal phase formed of a perovskite-type electrically conductive oxide containing at least La, Fe and Ni, and has an absolute value of thermoelectromotive force at 770° C. of 21.0 µV/K or less. Of various perovskite-type oxides, electrically conductive oxides containing La, Fe and Ni provide favorable physical properties of high electrical conductivity and a small absolute value of B constant (temperature coefficient) and thus are preferred electrode materials. Of such perovskite-type oxides, a sintered electrically conductive oxide having an absolute value of thermoelectromotive force at 770° C. of 21.0 µV/K or less is particularly suitable for forming an oxygen sensor electrode. That is, in an oxygen sensor, a temperature difference between the opposite ends of an electrode may possibly reach about 500° C.; however, by using a sintered electrically conductive oxide having an absolute value of thermoelectromotive force at 770° C. of 21.0 µV/K or less as an electrode material, noise generated due to a temperature difference between the opposite ends of an electrode attains a sufficiently low level, whereby an increase in measurement error can be restrained.

The electrically conductive oxide according to the present embodiment is a sintered oxide including a crystal phase having a perovskite-type oxide crystal structure satisfying the following compositional formula.

$$La_aCo_bFe_cNi_dO_x \qquad (1)$$

where $a+b+c+d \leq 1$, $1.25 \leq x \leq 1.75$). Also, preferably, the coefficients a, b, c and d satisfy the following relationships.

$$0.474 \leq a \leq 0.512 \qquad (2a)$$

$$0 \leq b \leq 0.225 \qquad (2b)$$

$$0 \leq c \leq 0.300 \qquad (2c)$$

$$0.200 \leq d \leq 0.350 \qquad (2d)$$

An electrically conductive oxide which satisfies the above expressions (2a) to (2d) has a room-temperature electrical conductivity of 200 S/cm or more and an absolute value of B constant of 200 K$^{-1}$ or less, and furthermore, an absolute value of thermoelectromotive force of 21.0 µV/K or less (more specifically, 11.0 µV/K or less). The term "room-temperature electrical conductivity" means electrical conductivity at 25° C. If the coefficient a of La (lanthanum) is less than 0.474 or in excess of 0.512, in some cases, the room-temperature electrical conductivity may fail to assume a value of 200 S/cm or more, or the absolute value of B constant may exceed 200 K$^{-1}$. Also, if the coefficient a of La (lanthanum) assumes an excessively large value in excess of 0.512, in some cases, sinterability may deteriorate. If the coefficient b of Co (cobalt) assumes a value in excess of 0.225, in some cases, the absolute value of thermoelectromotive force may exceed 21.0 µV/K depending on the firing temperature. If the coefficient c of Fe (iron) assumes a value of 0 or in excess of 0.300, in some cases, the room-temperature electrical conductivity may fail to assume a value of 200 S/cm or more, or the absolute value of B constant may exceed 200 K$^{-1}$, or the absolute value of thermoelectromotive force may exceed 21.0 µV/K. If the coefficient d of Ni (nickel) assumes a value less than 0.200 or in excess of 0.350, in some cases, the room-temperature electrical conductivity may fail to assume a value of 200 S/cm or more, or the absolute value of B constant may exceed 200 K$^{-1}$, or the absolute value of thermoelectromotive force may exceed 21.0 µV/K.

More preferably, the above-mentioned coefficients a, b, c and d satisfy the following relationships.

$$0.474 \leq a \leq 0.512 \quad (3a)$$

$$0 \leq b \leq 0.100 \quad (3b)$$

$$0 \leq c \leq 0.300 \quad (3c)$$

$$0.200 \leq d \leq 0.350 \quad (3d)$$

If the coefficients a, b, c and d satisfy the above relationships, the thermoelectromotive force can assume a small absolute value of 10.0 µV/K or less.

In the case where a sintered oxide having the above-mentioned composition is entirely formed of the perovskite phase, the coefficient x of O (oxygen) theoretically assumes a value of 1.5. However, since the oxygen proportion may deviate from a stoichiometric composition, the range of the coefficient x is typically specified as $1.25 \leq x \leq 1.75$.

What is required for the sintered electrically conductive oxide according to the embodiment of the present invention is to contain a perovskite phase having the above-described composition, and the sintered electrically conductive oxide may contain another oxide. For example, in a powder X-ray diffraction (XRD) measurement of the sintered electrically conductive oxide, the detection of a peak of an oxide of La MO$_3$ (M is Co, Fe or Ni) indicates that the sintered electrically conductive oxide contains the perovskite phase. Preferably, the sintered electrically conductive oxide contains a perovskite phase having the above-described composition in an amount of 50% by mass or more. Also, the sintered electrically conductive oxide is allowed to contain alkaline earth metal elements in such a very small amount as not to affect electrical conductivity. Preferably, the sintered electrically conductive oxide "contains substantially no alkaline earth metal elements." The expression "contains substantially no alkaline earth metal elements" means that, in the measurement of the contents of component elements by ICP emission analysis, the alkaline earth metal element content is 0.3% or less. The ICP emission analysis is performed in accordance with JIS K 0116 (2014), and a sample is dissolved in a solution of hydrochloric acid for pretreatment. An oxygen sensor using an electrode formed of a sintered electrically conductive oxide containing alkaline earth metal elements such as Sr in excess of 0.3% may potentially encounter the following problem: in use in a high-temperature working environment over a long period of time, alkaline earth metal elements diffuse into the material (e.g., yttria-stabilized zirconia) of a substrate of the oxygen sensor, causing a deterioration in physical properties of the electrode or in performance (impedance, etc.) of the oxygen sensor. Thus, desirably, the sintered electrically conductive oxide for an oxygen sensor contains substantially no alkaline earth metal elements.

The sintered oxide according to the embodiment of the present invention is used not only as an electrode material for an oxygen sensor, but also can be used as an alternative to metal for various electrodes, electric wirings, electrically conductive members, thermoelectric materials, heater materials and temperature detection elements. For example, an electrically conductive member can be embodied as an electrically conductive layer of the sintered electrically conductive oxide formed on the surface of a ceramic substrate.

B. Manufacturing Method

FIG. 1 is a flowchart showing a method of manufacturing a sintered electrically conductive oxide according to the embodiment of the present invention. In step T110, material powders for a sintered electrically conductive oxide are measured out and are then wet-mixed, followed by drying to prepare a material powder mixture. The material powders are, for example, La(OH)$_3$, Co$_3$O$_4$, Fe$_2$O$_3$ and NiO. Preferably, these material powders have a purity of 99% or higher. In place of La(OH)$_3$, La$_2$O$_3$ can be used as an La material; preferably, La(OH)$_3$ rather than La$_2$O$_3$ is used. This is for the following reason: since La$_2$O$_3$ has water absorbency, accurate preparation of a material powder mixture is difficult; thus, a deterioration in electrical conductivity and a deterioration in reproducibility may possibly be incurred. In step T120, the material powder mixture is calcined at a temperature of 700° C. to 1,200° C. for one to five hours in an air atmosphere to obtain a calcined powder. In step T130, to the calcined powder, an organic binder is added in an appropriate amount; then, the resultant mixture, together with a dispersant solvent (e.g., ethanol), is charged into a resin pot and then wet-mixed-and-pulverized by use of zirconia balls, thereby yielding a slurry. In step T130, the slurry thus obtained is dried at 80° C. for two hours; furthermore, the dried substance is passed through a 250 µm mesh for granulation. In step T140, the thus formed powder is compacted by a press (compacting pressure: 98 MPa). In step T150, the compact thus obtained is fired at a firing temperature (1,300° C. to 1,600° C.) higher than the calcining temperature in step T120 for one to five hours in an air atmosphere, to thereby yield a sintered electrically conductive oxide. After firing, a surface of the sintered electrically conductive oxide may be polished as needed.

Figure 2A:
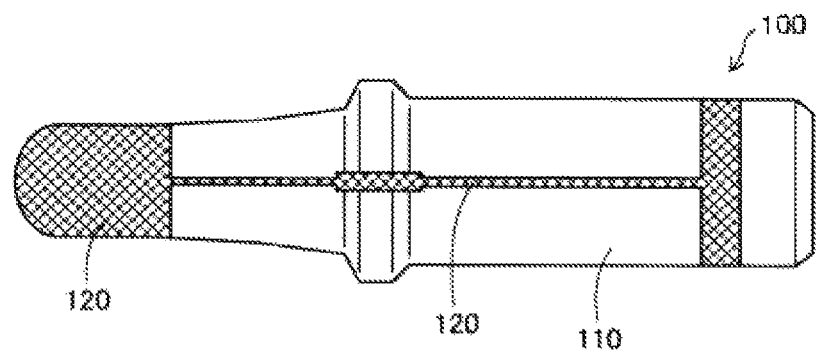
FIG. 2A is a front view showing an example oxygen sensor.
Figure 2B:
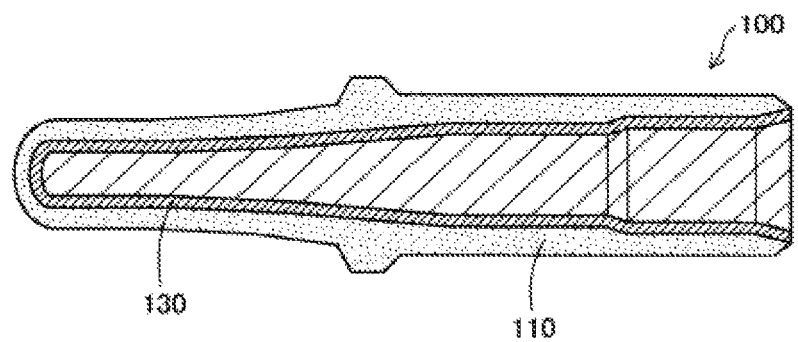
FIG. 2B is a sectional view of the oxygen sensor of FIG. 2A.

FIG. 2A is a front view showing an example oxygen sensor using the sintered electrically conductive oxide, and FIG. 2B is a sectional view of the oxygen sensor. An oxygen sensor 100 includes a closed-bottomed tubular substrate 110 extending in the longitudinal direction and formed of ceramic (specifically, zirconia doped with yttria serving as a stabilizer), an external noble-metal electrode 120 formed on the outer surface of the substrate 110, and a reference electrode 130 formed on the inner surface of the substrate 110. The reference electrode 130 is an electrical conductor layer formed of the sintered electrically conductive oxide. In this example, the reference electrode 130 is formed on the substantially entire inner surface of the substrate 110. While the external electrode 120 is in contact with gas to be measured such as exhaust gas, the reference electrode 130 is in contact with reference gas (e.g., air) having an oxygen concentration which serves as a reference in detecting the oxygen concentration of the gas to be measured. The length of the reference electrode 130 depends on design of the oxygen sensor 100 and is typically 1 cm to 10 cm. Particularly, in the case where the reference electrode 130 is provided over a length of 5 cm or more, since a large voltage difference arises between opposite ends of the reference electrode 130 due to the thermoelectromotive force generated from a temperature difference between the opposite ends of the reference electrode 130, the accuracy of the oxygen sensor 100 is highly susceptible to deterioration.

Figure 3:
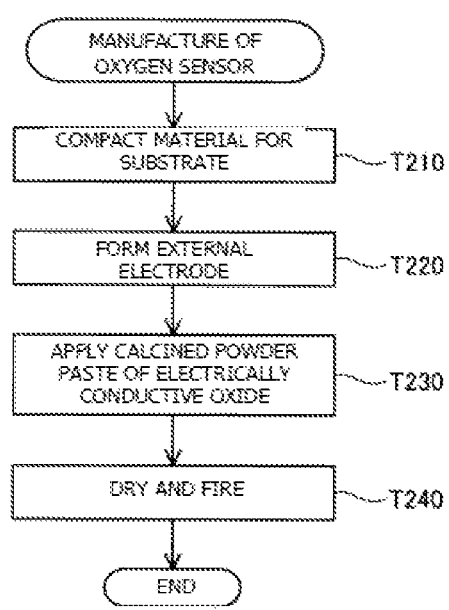
FIG. 3 is a flowchart showing a method of manufacturing the oxygen sensor.

FIG. 3 is a flowchart showing a method of manufacturing the oxygen sensor 100. In step T210, material (e.g., yttria-stabilized zirconia powder) for the substrate 110 is compacted by pressing, and the compact thus obtained is machined into the shape (tubular shape) shown in FIG. 2, to thereby yield a green workpiece (green compact). In step T220, the external electrode 120 is formed, using a Pt or Au paste, on the surface of the green workpiece by printing or dipping. In step T230, the calcined electrode material powder formed according to steps T110 and T120 of FIG. 1, together with a binder such as ethyl cellulose, is dissolved in a solvent such as terpineol or butyl carbitol to form a paste, and the paste is applied to the inner surface of a sintered tubular compact made of yttria-stabilized zirconia. In step T240, the sintered tubular compact is dried and then fired in the atmosphere (air), for example, at a temperature of 1,250° C. to 1,600° C. for one to five hours, to thereby obtain an oxygen sensor. The manufacturing conditions of the manufacturing methods shown in FIGS. 1 and 3 are provided by way of example and can be modified as appropriate depending on, for example, the intended use of a product.

C. Example and Comparative Example

FIG. 4 shows compositions and physical properties of samples of an example and a comparative example. In FIG. 4, samples marked with "*" are comparative examples, whereas samples not marked with "*" are examples. Sintered oxides of the samples were manufactured by the manufacturing method described with reference to FIG. 1 and were finally surface-polished into a rectangular parallelepiped shape measuring 3.0 mm×3.0 mm×15.0 mm. In step T110, materials were measured out and mixed so as to have the compositions shown in FIG. 4.

The samples other than samples S21 and S22 were formed by firing at a temperature of 1,600° C. Samples S21 and S22 have the same composition and were formed by firing at 1,350° C. and 1,550° C., respectively. The influence of firing temperature will be described below.

FIG. 4 shows electrical conductivity at 25° C. (room temperature) and at 870° C., B constant (temperature coefficient), and thermoelectromotive force with respect to the samples. These physical properties were measured or evaluated as follows.

Measurement of Electrical Conductivity

Electrical conductivity was measured using a DC 4-terminal method. Electrodes and electrode wires of Pt were used for measurement. Also, in the measurement of electrical conductivity, a voltage/current generator (Monitor 6242, a product of ADC Corporation) was used.

Measurement of B Constant

B constant ($K^{-1}$) was calculated from electrical conductivities at 25° C. and 870° C. according to the following formula.

$$B \text{ constant} = \ln(\rho_1/\rho_2)/(1/T_1 - 1/T_2) \quad (4)$$

$\rho_1 = 1/\sigma_1$
$\rho_2 = 1/\sigma_2$
$\rho_1$: resistivity ($\Omega$cm) at absolute temperature $T_1$ (K)
$\rho_2$: resistivity ($\Omega$cm) at absolute temperature $T_2$ (K)
$\sigma_1$: electrical conductivity (S/cm) at absolute temperature $T_1$ (K)
$\sigma_2$: electrical conductivity (S/cm) at absolute temperature $T_2$ (K)
$T_1 = 298.15$ (K)
$T_2 = 1,143.15$ (K)

Measurement of Thermoelectromotive Force

Thermoelectromotive force was measured by a steady DC method. Pt wires were wound on each sample (3.0 mm×3.0 mm×15 mm) at two positions located slightly toward the center from the longitudinally opposite ends with a predetermined distance therebetween, for use as electrodes for measuring a potential difference. Also, Au was deposited on each sample at the opposite ends by sputtering, and outer platinum electrodes formed of a Pt plate or a Pt mesh were provided at the opposite ends. In this state, the opposite ends of the sample were held by respective quartz tubes, whereby the sample was fixed. In the measurement, a constant current was applied between the two outer platinum electrodes, and high-temperature air was supplied to one of the two quartz tubes for generating a temperature difference between the outer platinum electrodes. Furthermore, an R thermocouple (Pt/Pt13Rh) was attached to the outer platinum electrodes for reading a temperature difference. The air flow rate was changed so as to generate a temperature difference stepwise, whereby the interrelation between the potential difference and the temperature difference was obtained. Then the thermoelectromotive force at 770° C. was calculated by the method of least squares. In the measurement, the product RZ2001k of Ozawa Science Co., Ltd. was used. Also, the measurement was conducted in the atmosphere (air).

Samples S1 to S17 in FIG. 4 satisfy the compositions expressed by the above-mentioned expressions (1) and (2a) to (2d). These samples S1 to S17 exhibited good physical properties; specifically, a room-temperature electrical conductivity of 200 S/cm or more and an absolute value of B constant of 400 $K^{-1}$ or less (particularly, 200 $K^{-1}$ or less) and furthermore an absolute value of thermoelectromotive force of 21.0 µV/K or less (more accurately, 11.0 µV/K or less). Also, samples S23 to S25 exhibited good physical properties such that, although the room-temperature electrical conductivity assumed a value slightly lower than 200 S/cm, the absolute value of B constant was 400 $K^{-1}$ or less, and the absolute value of thermoelectromotive force was 21.0 µV/K or less.

Samples S21 and S22 of the comparative example had the same composition but differed in firing temperature. Sample S22 fired at 1,550° C. exhibited sufficiently good physical properties, whereas sample S21 fired at 1,350° C. was not preferred in that the absolute value of thermoelectromotive force was 23.5 µV/K; i.e., in excess of 21.0 µV/K. Sample S26 is not preferred in view of poor sinterability. Samples S27 and S28 exhibited insufficient physical properties with respect to all of room-temperature electrical conductivity, B constant and thermoelectromotive force.

Of samples S1 to S17 of the example, samples S4 to S16 satisfied the above-mentioned expressions (1) and (3a) to (3d). Samples S4 to S16 are preferred in view of a small absolute value of thermoelectromotive force of 10.0 µV/K or less.

FIG. 5 is a reprint of FIG. 4 with respect to samples S22 and S1 to S6. These samples are fixed with respect to the coefficient a of La and the coefficient d of Ni (a=0.50, d=0.25) and differ with respect to the coefficient b of Fe and the coefficient c of Co.

Figure 6A:
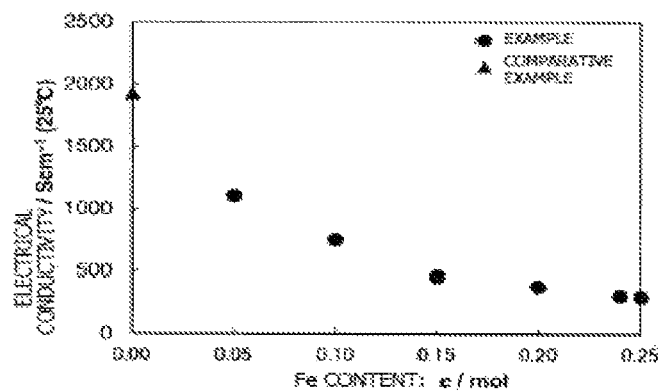
FIG. 6A is a graph showing a change in electrical conductivity with a change in Fe content.
Figure 6B:
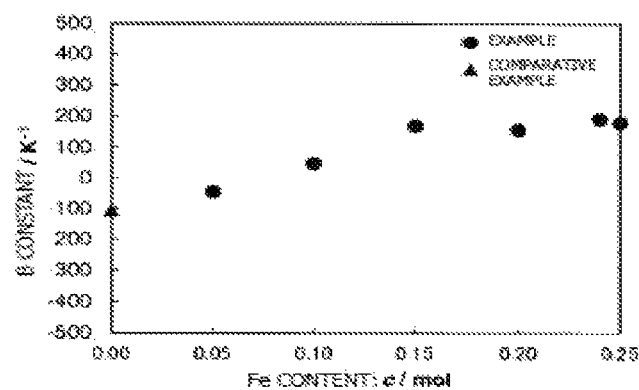
FIG. 6B is a graph showing a change in B constant with a change in Fe content.
Figure 6C:
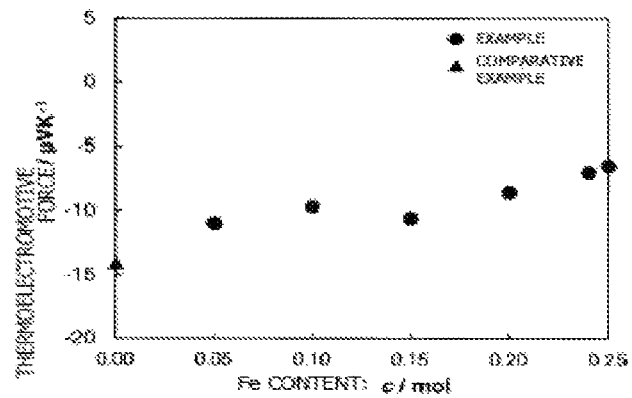
FIG. 6C is a graph showing a change in thermoelectromotive force with a change in Fe content.

FIGS. 6A to 6C are graphs showing a change in physical properties with a change in the coefficient c of Fe with respect to samples S22 and S1 to S6 of FIG. 5. As for room-temperature electrical conductivity (FIG. 6A), the smaller the coefficient c of Fe, the better. The B constant assumes an excellent absolute value at any value of the coefficient c of Fe (FIG. 6B). As for the absolute value of thermoelectromotive force (FIG. 6C), the larger the coefficient c of Fe, the better. Particularly, in view of reduction in the absolute value of thermoelectromotive force, a range of the coefficient c of $0.20 \leq c \leq 0.25$ is particularly preferred. In these samples (FIG. 5), because of b+c=0.25, a range of the coefficient b of Co of $0 \leq b \leq 0.05$ is particularly preferred.

FIG. 7 is a reprint of FIG. 4 with respect to samples S6 to S10, S25, S27 and S28. These samples are fixed with respect to the coefficient a of La and the coefficient b of Co (a=0.50, b=0) and differ with respect to the coefficient c of Fe and the coefficient d of Ni.

Figure 8A:
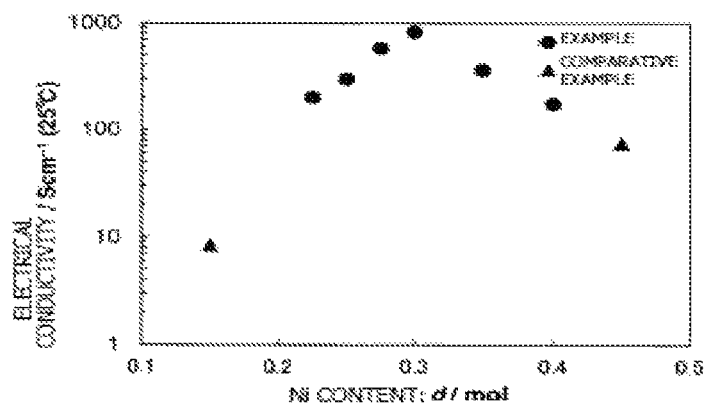
FIG. 8A is a graph showing a change in electrical conductivity with a change in Ni content.
Figure 8B:
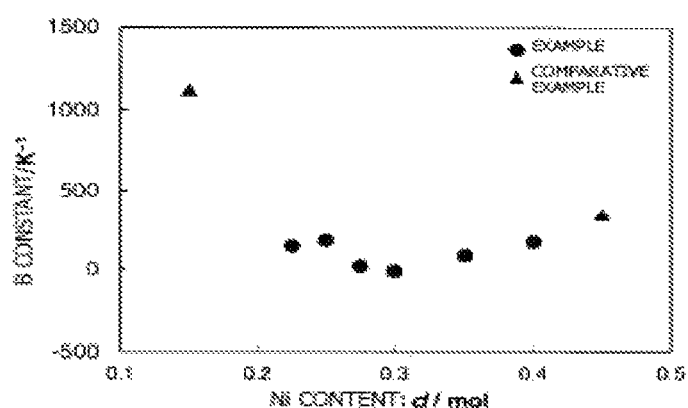
FIG. 8B is a graph showing a change in B constant with a change in Ni content.
Figure 8C:
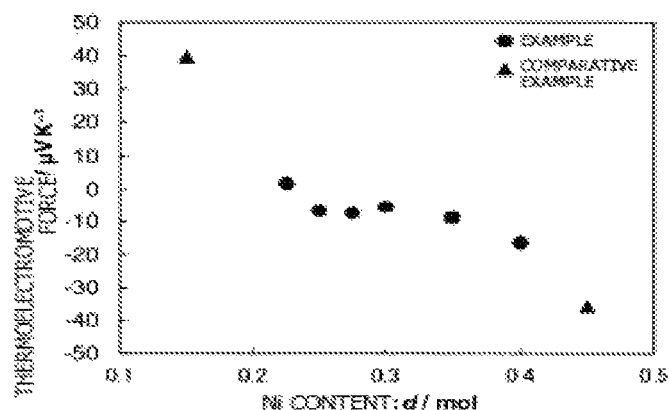
FIG. 8C is a graph showing a change in thermoelectromotive force with a change in Ni content.

FIGS. 8A to 8c are graphs showing a change in physical properties with a change in the coefficient d of Ni with respect to samples S6 to S10, S25, S27 and S28 of FIG. 7. According to these graphs, as to any of the three physical properties of room-temperature electrical conductivity, the absolute value of B constant and the absolute value of thermoelectromotive force, a range of the coefficient d of Ni of $0.20 \leq d \leq 0.35$ is particularly preferred. In these samples (FIG. 7), because c+d=0.50, a range of the coefficient c of Fe of $0.15 \leq c \leq 0.30$ is particularly preferred. Sample S25 had quite good physical property values in that the absolute value of thermoelectromotive force is 21.0 µV/K or less and the absolute value of B constant is 200 $K^{-1}$ or less, but exhibited a slightly low value of room-temperature electrical conductivity of lower than 200 S/cm.

FIG. 9 shows the results of an experiment as to the influence of firing temperature on thermoelectromotive force. Samples S31 to S34 had the same composition as that of sample S6 mentioned above (FIG. 4) but differed in firing temperature. Samples S41 and S42 had the same composition as that of sample S10 mentioned above (FIG. 4) but differed in firing temperature. FIG. 9 is a reprint of FIG. 4 with respect to samples S21 and S22. As understood from the experimental results, even in the case of the same composition, the thermoelectromotive force tends to decrease as the firing temperature increases. Thus, the thermoelectromotive force can be adjusted by changing the firing temperature. However, in the case of a low firing temperature as in sample S31, sintering may be insufficient depending on composition. Therefore, preferably, the firing temperature falls within a range of 1,250° C. to 1,600° C., particularly preferably within a range of 1,500° C. to 1,600° C.

FIG. 10 shows the results of an experiment as to the influence of La materials on physical properties. Samples S51 and S52 had the same composition as that of sample S6 mentioned above (FIG. 4) but differed in La material. Samples S53 and S54 had the same composition as that of sample S8 mentioned above (FIG. 4) but differed in La material. Specifically, samples S52 and S54 used, as an La material, $La_2O_3$ in place of $La(OH)_3$. The fired oxide of sample S52 suffered cracking, such that its physical properties could not be measured. Sample S54 failed to have sufficient physical properties; specifically, sample S54 exhibited a room-temperature electrical conductivity of less than 200 S/cm and an absolute value of B constant in excess of 200 $K^{-1}$. Also, since $La_2O_3$ has water absorbency, accurate preparation of the material powder mixture is difficult, and difficulty is encountered in reproducing a sintered oxide having stable physical properties. Therefore, La(OH)3 is preferred as the La material.

The invention has been described in detail with reference to the above embodiments. However, the invention should not be construed as being limited thereto. It should further be apparent to those skilled in the art that various changes in form and detail of the invention as shown and described above may be made. It is intended that such changes be included within the spirit and scope of the claims appended hereto.

This application is based on Japanese Patent Application No. 2015-097946 filed May 13, 2015, incorporated herein by reference in its entirety.

What is claimed is:

1. An oxygen sensor for measuring a concentration of a gas to be measured, the oxygen sensor comprising:
 a closed-bottomed tubular substrate formed of ceramic and extending in a longitudinal direction;
 an external electrode formed of a noble metal and disposed on an outer surface of the substrate; and
 a reference electrode disposed on an inner surface of the substrate,
 wherein
 the reference electrode is an electrically conductive layer formed of a sintered electrically conductive oxide,
 the sintered electrically conductive oxide comprises a crystal phase formed of a perovskite-type electrically conductive oxide having a crystal structure expressed by following formula (1):

$$La_aCo_bFe_cNi_dO_x \qquad (1),$$

wherein, in formula (1):

$$a+b+c+d=1,$$

$$1.25 \leq x \leq 1.75,$$

$$0.474 \leq a \leq 0.512,$$

$$0 \leq b \leq 0.225,$$

$$0 < c \leq 0.300, \text{ and}$$

the sintered electrically conductive oxide has an absolute value of thermoelectromotive force at 770° C. of 21.0 µV/K or less.

2. The oxygen sensor as claimed in claim 1, wherein, in formula (1):

$0.474 \leq a < 0.512$.

3. The oxygen sensor as claimed in claim 1, wherein the sintered electrically conductive oxide contains substantially no alkaline earth metal elements.

4. The oxygen sensor as claimed in claim 1, wherein the external electrode is configured for contact with the gas to be measured, and the reference electrode is configured for contact with a gas serving as a reference for detecting the oxygen concentration of the gas to be measured.

5. The oxygen sensor as claimed in claim 1, wherein the reference electrode has a length in the longitudinal direction from 1 cm to 10 cm.

6. The oxygen sensor as claimed in claim 1, wherein the substrate is formed of zirconia doped with yttria.

7. The oxygen sensor as claimed in claim 1, wherein the crystal phase formed of the perovskite-type electrically conductive oxide has the crystal structure expressed by following formula (2):

$La_a Fe_c Ni_d O_x$     (2), wherein, in formula (2):

$a+c+d=1$, $1.25 \leq x \leq 1.75$, $0.474 \leq a \leq 0.512$, $0 < c \leq 0.300$, and $0.200 \leq d \leq 0.350$.

8. The oxygen sensor as claimed in claim 1, wherein a and b satisfy $0.474 \leq a < 0.512$, and $0 \leq b < 0.100$.

9. The oxygen sensor as claimed in claim 1, wherein b satisfies $0 < b < 0.100$.

* * * * *